United States Patent
Ishioka et al.

(10) Patent No.: US 10,178,286 B2
(45) Date of Patent: Jan. 8, 2019

(54) METHOD FOR FORMING COLOR FILTER ARRAY, METHOD FOR MANUFACTURING IMAGING APPARATUS, AND IMAGING APPARATUS

(71) Applicant: CANON KABUSHIKI KAISHA, Tokyo (JP)

(72) Inventors: Masao Ishioka, Tokyo (JP); Daisuke Shimoyama, Yamato (JP); Takayuki Sumida, Kawasaki (JP); Kei Aoki, Ebina (JP); Yasuhiro Kawabata, Kawasaki (JP); Naoki Inatani, Kawasaki (JP); Tomoyuki Tezuka, Sagamihara (JP); Jun Iwata, Kawasaki (JP); Masaki Kurihara, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 656 days.

(21) Appl. No.: 14/838,145

(22) Filed: Aug. 27, 2015

(65) Prior Publication Data

US 2016/0065916 A1    Mar. 3, 2016

(30) Foreign Application Priority Data

Aug. 29, 2014   (JP) ................................. 2014-176288

(51) Int. Cl.
| | |
|---|---|
| H01L 21/14 | (2006.01) |
| H04N 5/225 | (2006.01) |
| G02B 5/20 | (2006.01) |
| G03F 7/00 | (2006.01) |
| G03F 7/20 | (2006.01) |
| G03F 7/32 | (2006.01) |
| G03F 7/40 | (2006.01) |
| H01L 27/146 | (2006.01) |

(52) U.S. Cl.
CPC ........... *H04N 5/2254* (2013.01); *G02B 5/201* (2013.01); *G03F 7/0007* (2013.01); *G03F 7/20* (2013.01); *G03F 7/32* (2013.01); *G03F 7/40* (2013.01); *H01L 27/14621* (2013.01); *H01L 27/14685* (2013.01); *H01L 27/14627* (2013.01)

(58) Field of Classification Search
CPC ... H01L 27/14621; G02B 5/201; G02B 5/223; G03F 7/0007; G03F 7/40
USPC ............................................... 430/7; 257/440
See application file for complete search history.

(56) References Cited

U.S. PATENT DOCUMENTS

| | | | | |
|---|---|---|---|---|
| 2009/0114888 A1* | 5/2009 | Nishida | ................. | G02B 5/201 252/586 |
| 2014/0151614 A1* | 6/2014 | Muro | ................ | H01L 27/14621 252/586 |

FOREIGN PATENT DOCUMENTS

| | | | |
|---|---|---|---|
| JP | H11211907 A | | 8/1999 |
| JP | 2002040408 A | | 2/2002 |
| JP | 2003-022994 A | | 1/2003 |
| JP | 2003-093943 A | | 4/2003 |
| JP | 2007148160 A | | 6/2007 |
| JP | 2008055403 A | | 3/2008 |
| JP | 2008242273 A | | 10/2008 |
| JP | 2009080194 A | | 4/2009 |
| JP | 2010-085754 A | | 4/2010 |
| JP | 2014-215379 A | * | 11/2014 |

OTHER PUBLICATIONS

Computer-generated translation of JP 2014-215379 (Nov. 2014). (Year: 2014).*

* cited by examiner

*Primary Examiner* — John A McPherson
(74) *Attorney, Agent, or Firm* — Canon U.S.A., Inc. IP Division (57) ABSTRACT

A method for forming a color filter array includes a step of exposing a photosensitive color filter film, a step of forming a color filter array from the color filter film by developing the color filter film using a developer, and a step of cleaning the color filter array while rotating the color filter array and moving a nozzle for spraying fluid containing liquid and gas above the color filter array in a direction intersecting with an axis of the rotation. The method reduces variation in thickness of a color filter that is generated in the cleaning step.

5 Claims, 7 Drawing Sheets

| 62 | 61 | 62 | 61 | 62 |
|----|----|----|----|----|
| 61 | 63 | 61 | 63 | 61 |
| 62 | 61 | 62 | 61 | 62 |
| 61 | 63 | 61 | 63 | 61 |
| 62 | 61 | 62 | 61 | 62 |

| f (L/min) | R | UNEVENNESS |
|---|---|---|
| 30 | 1.3% | NEGLIGIBLE |
| 40 | 1.4% | NEGLIGIBLE |
| 50 | 1.7% | NEGLIGIBLE |
| 55 | 2.0% | NEGLIGIBLE |
| 60 | 2.3% | NOT NEGLIGIBLE |

| n (rpm) | v (mm/s) | n/v | R | UNEVENNESS |
|---|---|---|---|---|
| 700 | 40 | 17.5 | 2.3% | NOT NEGLIGIBLE |
| 700 | 20 | 35 | 1.8% | NEGLIGIBLE |
| 700 | 10 | 70 | 1.8% | NEGLIGIBLE |
| 1400 | 20 | 70 | 1.4% | NEGLIGIBLE |
| 1400 | 10 | 140 | 1.4% | NEGLIGIBLE |
| 2000 | 20 | 100 | 1.1% | NEGLIGIBLE |

METHOD FOR FORMING COLOR FILTER ARRAY, METHOD FOR MANUFACTURING IMAGING APPARATUS, AND IMAGING APPARATUS

BACKGROUND OF THE INVENTION

Field of the Invention

This technique relates to a color filter array.

Description of the Related Art

A color filter array used in an optical apparatus such as an imaging apparatus and a display apparatus is formed by exposing a photosensitive color filter film into a desired pattern, and developing and cleaning the obtained photosensitive color filter film.

In photosensitive color filter materials, residues are likely to be generated in a development step. In particular, in a case in which a photosensitive color filter material contains pigment particles for coloring, when being mixed with photosensitive resin, a gel-like form is likely to be caused due to aggregation. In the development step of the color filter film, it is therefore effective to use a two-fluid cleaning method, which is a cleaning method with high cleaning power.

The two-fluid cleaning method is conducted in the following manner for the purpose described below. After a development reaction process is performed by discharging a developer onto the exposed color filter film to form a color filter array, the two-fluid cleaning method is conducted for removing the developer and residues. In the two-fluid cleaning method, a cleaning process is performed while spraying fluid containing gas such as nitrogen and dry air and liquid such as water from the leading edge of a nozzle of a cleaning apparatus. According to the two-fluid cleaning method, residues generated during the development can be removed by physical pressure caused by droplets sprayed in an accelerated manner.

Japanese Patent Application Laid-Open No. 11-211907 discloses rotating a substrate to which a photosensitive coloring pigment resist is applied, horizontally reciprocating a nozzle, and simultaneously spraying pure water and gas from the nozzle onto the substrate.

Figure 7A:
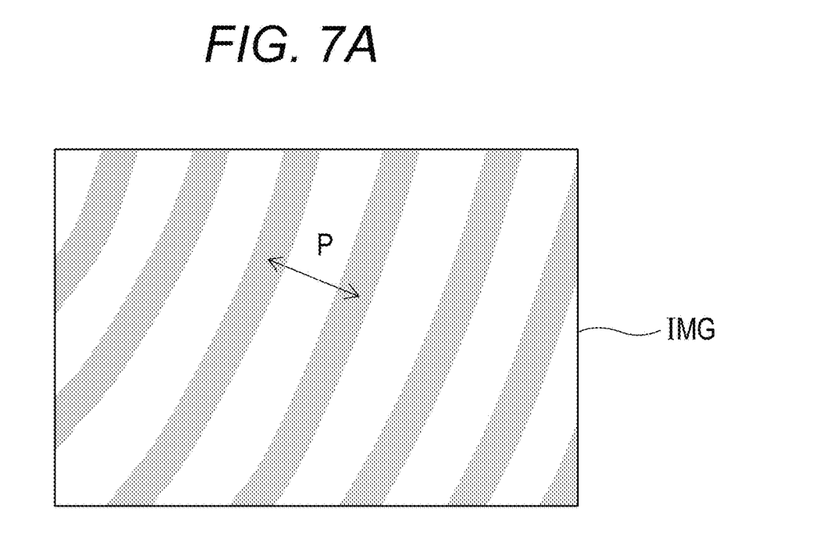
FIGS. 7A and 7B are schematic views illustrating periodical unevenness.

The color filter array was thus formed by using the two-fluid cleaning method, and a highly sensitive imaging apparatus was manufactured. At this time, it was found that periodical unevenness is generated in a captured image IMG as illustrated in FIG. 7A, for example. A period P of this periodical unevenness corresponds to a range of 1 to 10 mm in an imaging region of the imaging apparatus. In light of the fact that a pixel size is 1 to 10 μm, such unevenness is not considered to be the one resulting from the configuration of pixels.

Figure 7B:
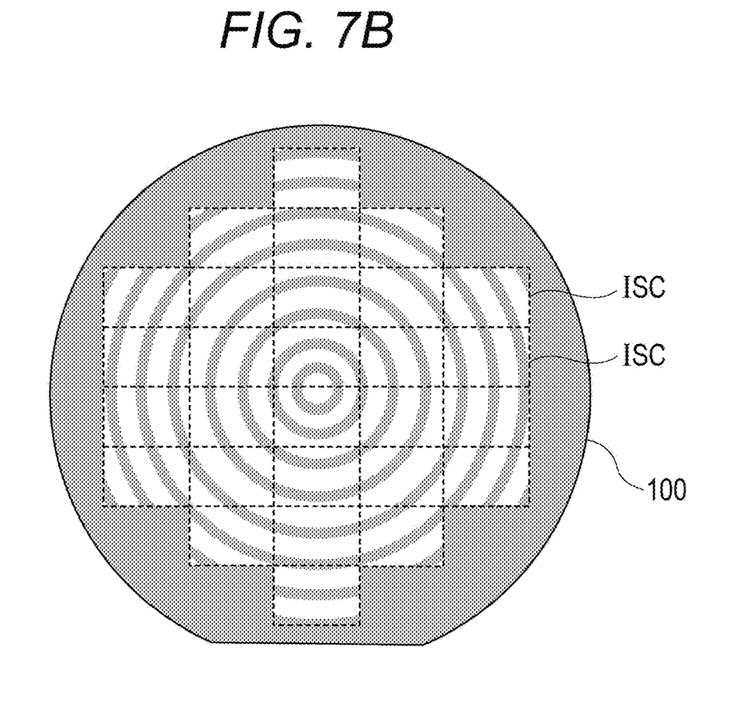

The present inventor considered in detail, and it was found that the pattern of the unevenness generated in the image captured by the imaging apparatus differs depending on the position within a wafer 100 from which chips constituting the imaging apparatus are cut out. Furthermore, as illustrated in FIG. 7B, when images obtained by respective chip ISCs are joined together so as to correspond to the positions of the chip ISCs on the wafer 100, it was found that unevenness is generated substantially concentrically from the center chip ISC of the wafer 100.

SUMMARY OF THE INVENTION

This technique aims to reduce the above-mentioned periodical unevenness.

A means for solving the above-described issue is a method for forming a color filter array including a step of exposing a photosensitive color filter film, a step of forming a color filter array from the color filter film by developing the color filter film using a developer, and a step of cleaning the color filter array with fluid containing liquid and gas, while rotating the color filter array and moving a nozzle for spraying the fluid above the color filter array in a direction intersecting with an axis of the rotation, wherein the cleaning step is performed so that an amplitude of a change in thicknesses of respective color filters of the color filter array, the respective color filters corresponding to a plurality of pixels, becomes 2.0% or less of an average value of the thicknesses of the respective color filters after the cleaning step. Another means for solving the above-described issue is an imaging apparatus including a plurality of pixels respectively having color filters with the same color, wherein an average value of thicknesses of the respective color filters of the plurality of pixels is less than 0.75 μm, wherein the thicknesses of the respective color filters of the plurality of pixels periodically change at an interval of 10 times or more of an interval between the plurality of pixels, and wherein an amplitude of the change is 2.0% or less of the average value.

Further features of the present invention will become apparent from the following description of exemplary embodiments (with reference to the attached drawings).

DESCRIPTION OF THE EMBODIMENTS

Exemplary embodiments of the present invention will be described below with reference to the drawings. In the following description and the drawings, configurations common to a plurality of drawings are assigned identical numerals. Thus, the common configurations will be described cross-referring to the plurality of drawings, and the description of the configurations that are assigned identical numerals will be appropriately omitted.

Figure 1A:
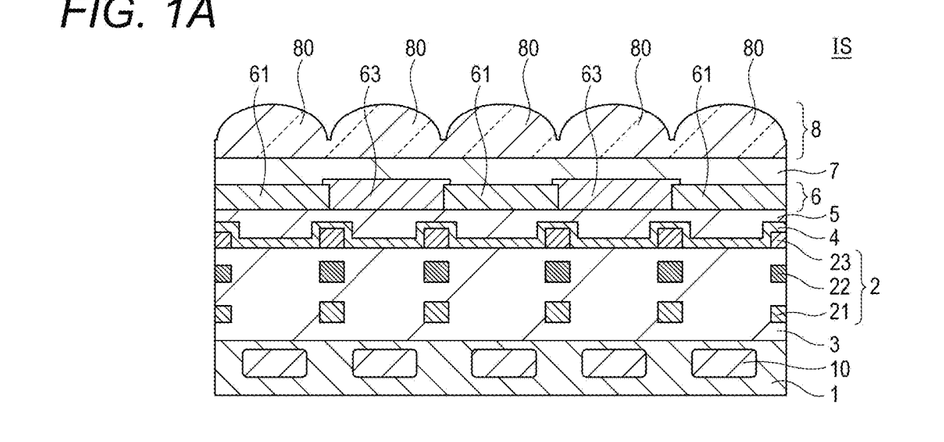
FIGS. 1A, 1B, and 1C are schematic views illustrating an imaging apparatus.
Figure 1B:
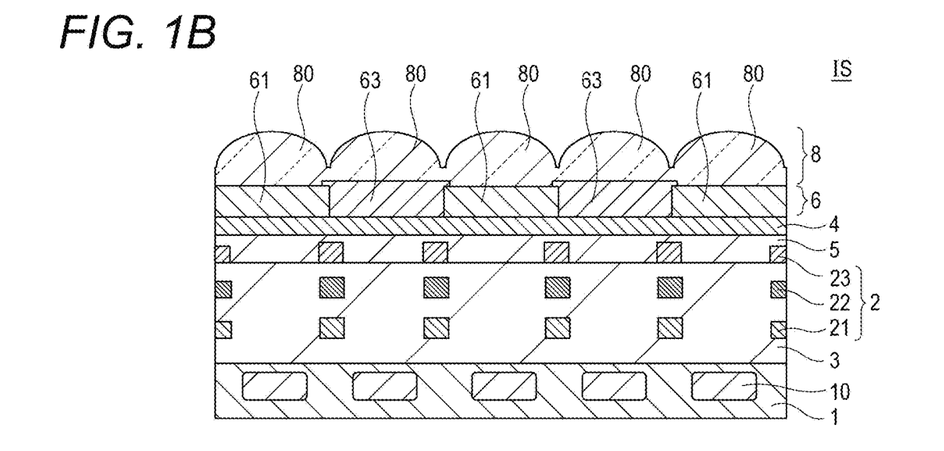
Figure 1C:
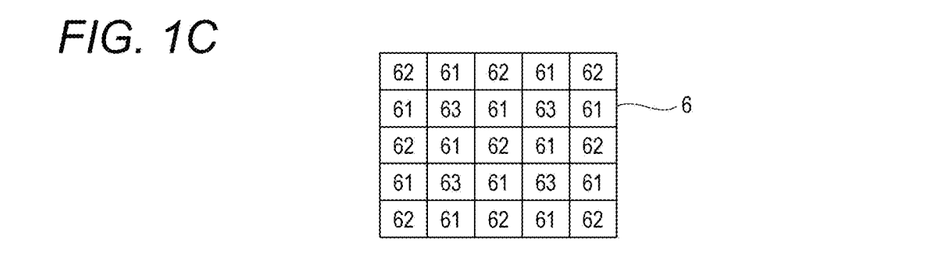

FIGS. 1A and 1B respectively illustrate a first example and a second example of a cross-sectional structure of a complementary metal-oxide semiconductor (CMOS) image sensor as an example of an imaging apparatus image sensor (IS). The imaging apparatus IS includes a plurality of pixels. Each pixel includes a color filter 61 with a first color, a color filter 62 with a second color (not illustrated), or a color filter 63 with a third color. Each pixel further includes a photodiode 10 and a microlens 80. The photodiode 10 serves as a photoelectric conversion unit provided in a substrate 1 formed of a semiconductor such as silicon. As illustrated in FIG. 1C, the color filters 61 with the first color, the color filters 62 with the second color, and the color filters 63 with the third color are arranged in a Bayer array so as to constitute a color filter array 6. The respective thicknesses of the color filters 61, 62, and 63 are, for example, 0.50 to 1.0 μm. A color filter with a thickness of less than 0.75 μm can be regarded as a relatively thin color filter. In contrast, a color filter with a thickness of 0.75 μm or more can be regarded as a relatively thick color filter. In addition, the respective thicknesses of the color filter 61 with the first color, the color filter 62 with the second color, and the color filter 63 with the third color may be different from one another. For example, at least either of a green color light filter and a blue color light filter may be thinner than a red color light filter. With such a configuration, the sensitivity to blue color light to which the photodiode 10 has low sensitivity, and the sensitivity to green color light to which human eyes are sensitive can be increased. On the color filter array 6, a plurality of microlenses 80 is arrayed in a matrix to constitute a microlens array 8.

In addition, the respective thicknesses of the color filters 61, 62, and 63 are preferably made smaller as far as possible so as not to cause light loss. More specifically, it is desirable that the respective thicknesses of the color filters 61, 62, and 63 are 0.1 times or more and 0.3 times or less of a pixel size. A color filter with a thickness of less than 0.20 times of the pixel size can be regarded as a relatively thin color filter. In contrast, a color filter with a thickness of 0.20 times or more of the pixel size can be regarded as a relatively thick color filter. At this time, the pixel size may be considered to be equivalent to a pixel pitch. More specifically, the distance between vertices of the microlenses 80 in pixels adjacent to each other may be regarded as the pixel size.

A wiring structure 2 is provided between the color filter array 6 and the substrate 1. The wiring structure 2 includes a plurality of wiring layers 21, 22, and 23. Each of the wiring layers 21, 22, and 23 is a copper layer and/or an aluminum layer. An insulating film 3 forming an interlayer insulating layer is provided between the wiring layers. The insulating film 3 can be a multilayered film including a plurality of interlayer insulating layers. A passivation film 4 is provided between the wiring layer 23, which is a top wiring layer, and the color filter array 6. The passivation film 4 can be a multilayered film including an antireflection layer.

In the first example illustrated in FIG. 1A, recesses and projections are formed on the top surface of the passivation film 4 so as to reflect the shape of the wiring layer 23, which is the closest to the passivation film 4 in the wiring structure 2. In addition, a planarizing film 5 is provided between the passivation film 4 and the color filter array 6. The planarizing film 5 is provided for alleviating the recesses and projections generated by the underlying wiring layer 23. The planarizing film 5 is formed of, for example, acrylic resin. The top surface of the planarizing film 5 is evenly formed using a coating method such as spin coating. The thickness of the planarizing film 5 is about 0.10 to 1.0 μm, and is, for example, 0.50 μm.

In the first example, a planarizing film 7 is provided between the color filter array 6 and the microlens array 8. Similarly to the planarizing film 5 of the first example, the planarizing film 7 is provided for alleviating the recesses and projections generated by the underlying color filter array 6. The planarizing film 7 is formed of, for example, acrylic resin. The top surface of the planarizing film 7 is planarized by being formed using a coating method. The thickness of the planarizing film 7 is about 0.10 to 1.0 μm, and is, for example, 0.50 μm.

In the second example illustrated in FIG. 1B, the planarizing film 5 is provided between the wiring layer 23, which is the closest to the passivation film 4 in the wiring structure 2, and the passivation film 4. The top surface of the planarizing film 5 is planarized by, for example, a chemical mechanical planarization (CMP) method. In a case in which the passivation film 4 is even as in the second example, very high sensitivity can be achieved. In addition, in the second example, a layer forming the microlens array 8 is in contact with the color filter array 6.

The imaging apparatus IS can further include a package for storing chips including the substrate 1, the color filter array 6, and the like. The package can include a substrate to which the chips are fixed, a cover body facing the chips, and a connecting member for exchanging signals with outside.

An imaging system can be established by using the imaging apparatus IS. The imaging system is an information terminal including a camera or an image-capturing function. The imaging system can include a signal processing means for processing signals obtained from the imaging apparatus IS, and a display means for displaying an image captured by the imaging apparatus IS.

FIGS. 2A, 2B, 2C, 2D, 2E, 2F, 2G, and 2H are cross-sectional schematic views illustrating a method for forming the color filter array 6.

Figure 2A:
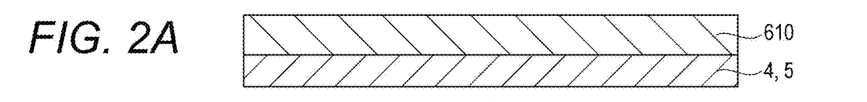
FIGS. 2A, 2B, 2C, 2D, 2E, 2F, 2G, and 2H are cross-sectional schematic views illustrating a method for forming a color filter array.

In a step a illustrated in FIG. 2A, a photosensitive color filter film 610 is formed on a wafer having the planarizing film 5 or the passivation film 4 that serves as a base film. The color filter film 610 is formed of a color filter material obtained by dispersing coloring pigment in resin, using a coating method such as spin coating. A color filter material of a dye type may be used. For photosensitivity of the color filter film 610, a negative type is preferable, but a positive type may be used.

Figure 2B:
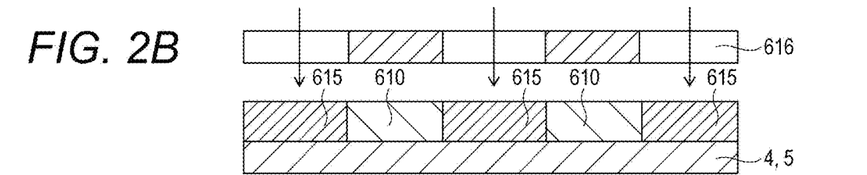

In a step b illustrated in FIG. 2B, the color filter film 610 is exposed into an appropriate pattern by an exposure device such as a stepper, using a photomask 616. In the negative-type color filter film 610, exposed portions are cured, so that latent images 615 are formed. In the color filter array 6 having the Bayer array, an exposure pattern of the color filter film 610 that is formed first is typically a checkered pattern, for example. The color filter film 610 can be a green color light filter film.

Figure 2C:
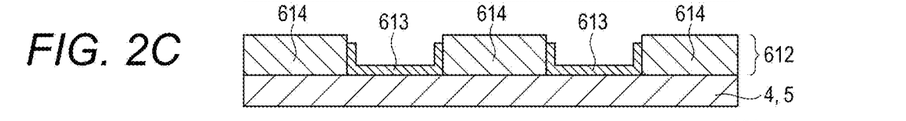

In a step c illustrated in FIG. 2C, a color filter array 612 including a plurality of color filter patterns 614 is formed from the color filter film 610 by developing the color filter film 610 using a developer. By performing a development process for 20 to 80 seconds using a developer containing tetramethylammonium hydroxide (TMAH), for example, unnecessary portions of the color filter film 610 are removed. At this time, in the case of the color filter film 610 containing pigment, residues 613 are likely to be generated.

Figure 2D:
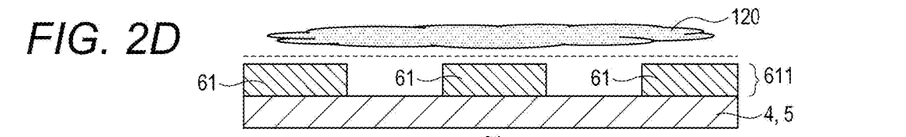

In a step d illustrated in FIG. 2D, the color filter array 612 is cleaned by the two-fluid cleaning method using fluid 120. Through the cleaning, the developer used in the development step is removed. In addition, the residues 613 generated during the development are also removed. As a result, a color filter array 611 including the color filters 61 each having a desired film thickness can be obtained. At this time, the color filters 61 can be smaller in thickness than the color filter patterns 614. In FIG. 2D, a dotted line indicates a position corresponding to the thickness of the color filter patterns 614 in FIG. 2C. Then, in a similar manner to the color filter array 611, a color filter array including the color filters 62 with the second color is formed. The color filter 62 that is formed second can be a blue color light filter. The blue color light filter can be used as a light shielding film in a peripheral circuit region in which a peripheral circuit of the imaging apparatus IS is provided.

Figure 2E:
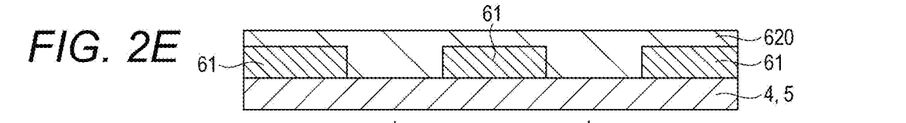

In a step e illustrated in FIG. 2E, a photosensitive color filter film 630 is formed on the color filter array 611. The color filter film 630 has a color different from that of the color filter film 610. In the color filter array 6 having the Bayer array, the color filter film 630 that is formed third can be a red color light filter.

Figure 2F:
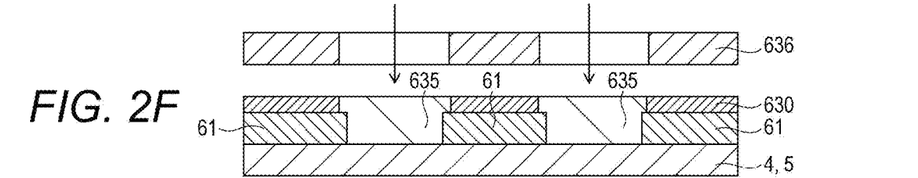

In a step f illustrated in FIG. 2F, the color filter film 630 is exposed into an appropriated pattern using a photomask 636 to form latent images 635 in the color filter film 630.

Figure 2G:
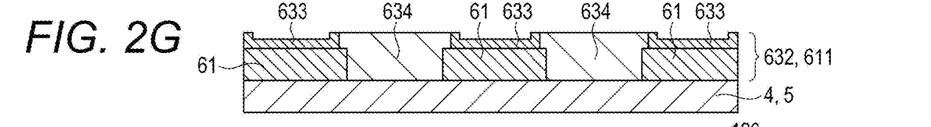

In a step g illustrated in FIG. 2G, a color filter array 632 including color filter patterns 634 is formed from the color filter film 630 by developing the color filter film 630 using a developer. At this time, in the case of the color filter film 630 containing pigment, residues 633 are likely to be generated.

Figure 2H:
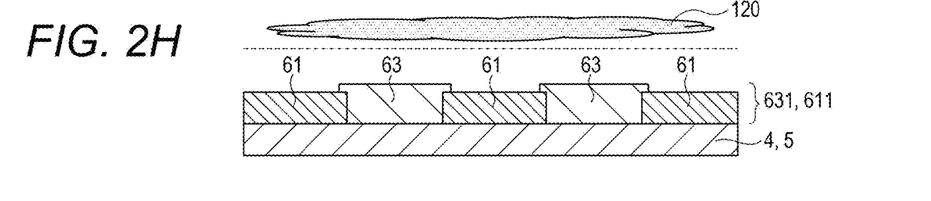

In a step h illustrated in FIG. 2H, the color filter array 632 is cleaned by the two-fluid cleaning method using the fluid 120. Through the cleaning, the developer used in the development step is removed. In addition, the residues 633 generated during the development are also removed. As a result, a color filter array 631 including the color filters 61 each having a desired film thickness can be obtained. At this time, the color filters 63 can be smaller in thickness than the color filter patterns 634. In FIG. 2H, a dotted line indicates a position corresponding to the thickness of the color filter patterns 634 in FIG. 2G.

In the above-described manner, the color filter array 6 including the color filters 61, 62, and 63 with the three colors is formed. Furthermore, the microlens array 8 is formed, so that the imaging apparatus IS can be manufactured.

A cleaning step will be described in detail with reference to FIGS. 3A, 3B, 3C, 3D, and 3E. The color filter array 612 illustrated in FIG. 2C is formed on the wafer 100 in FIG. 3A. In some cases, the above-mentioned residues 613 (not illustrated) of the color filter film 610 exist on the wafer 100.

Figure 3A:
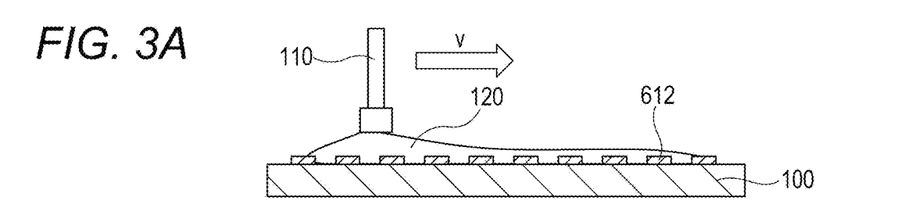
FIGS. 3A, 3B, 3C, 3D, and 3E are schematic views illustrating a method for forming a color filter array.

In the cleaning step, the two-fluid cleaning method is used. As illustrated in FIG. 3A, in the two-fluid cleaning method, the fluid 120 is sprayed onto the wafer 100 from a nozzle 110 of a cleaning apparatus (not illustrated). The diameter of a spray port of the nozzle 110 is, for example, 5 to 10 mm. The fluid 120 is mixture (two fluid) containing liquid as cleaning liquid, and gas for cleaning promotion. In the present exemplary embodiment, water is used as liquid, and nitrogen is used as gas, but other fluid may be used. For example, dry air may be used as an alternative to nitrogen. The flow rate of gas in the fluid 120 can be 10 L/min or more and 100 L/min or less. The flow rate of liquid in the fluid 120 can be 0.01 L/min or more and 1 L/min or less. The flow rate of liquid in the fluid 120 can be 1/10 or less of the flow rate of gas.

Figure 3B:
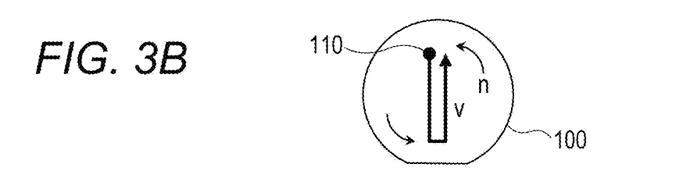

During the cleaning, as illustrated in FIG. 3B, the color filter array 612 is rotated in the arrangement surface of the color filter patterns 614. More specifically, the wafer 100 on which the color filter array 6 is formed is mounted on a stage of the cleaning apparatus, and the stage is rotated. Though the number of rotations n (rpm) of the color filter array 612 performed at this time is preferably 200 rpm or more and 4000 rpm or less, for example, the cleaning is executable even if the number of rotations n falls out of this range.

In addition, during the cleaning, as illustrated in FIG. 3B, the nozzle 110 is moved above the color filter array 612. The distance between the nozzle 110 and the color filter array 612 can be 1 mm or more and 20 mm or less, more preferably, 1 mm or more and 10 mm or less. The movement direction is a direction along the arrangement surface of the color filters 61, and is a direction intersecting with a rotational axis of the color filter array 612. At this time, the movement speed v (mm/s) of the nozzle 110 can be 1 mm/s or more and 100 mm/s or less, more preferably 10 mm/s or more and 50 mm/s or less. It is desirable that the nozzle 110 is moved in a direction orthogonal to the rotational axis of the color filter array 612, i.e., a direction parallel to the arrangement surface of the color filters 61. Alternatively, the nozzle 110 can be obliquely moved as long as the tilt angle is 30° or less. It is preferable that the nozzle 110 is linearly moved in such a manner that the nozzle 110 passes above the rotational center of the color filter array 612.

Figure 3C:
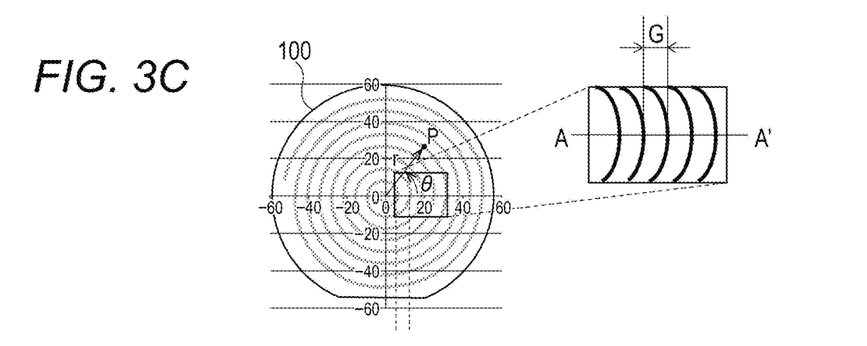
Figure 3D:
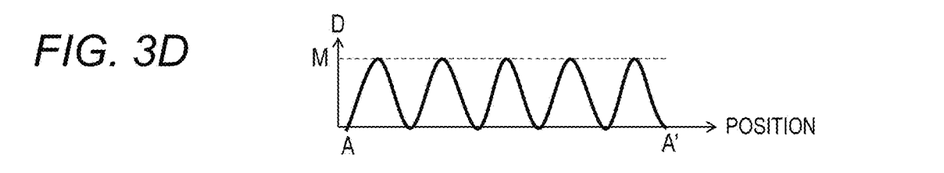
Figure 3E:
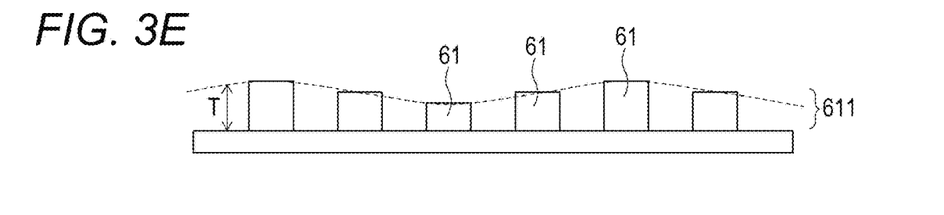

By the above-mentioned rotation of the color filter array 612 and the movement of the nozzle 110, portions in the color filters 61, above which the nozzle 110 has passed, form a spiral shape as illustrated in FIG. 3C. An interval G (mm) of this spiral is calculated as 60×v/n. If it is assumed that the number of rotations n=700 and the movement speed v=40, the period p≈3.4 (mm), which matches the order of a period p of unevenness generated in the chip. It can be therefore said that the unevenness generated in the image as illustrated in FIG. 7A and the distribution of the unevenness in the wafer 100 as illustrated FIG. 7B indicate unevenness resulting from the difference between the portions above which this nozzle 110 has passed and the portions above which the nozzle 110 has not passed. The cause of the unevenness generation was considered, and it has been found that, in the color filter array 612 including the plurality of color filters 61 with the same color in the color filter array 6, a subtle difference in thickness is generated among the color filters 61. This has been identified by measuring the height distribution of the surface of the color filter array 612 with an atomic force microscope (AFM). Here, it is to be noted that the measurement range of the AFM is 100 μm×100 μm at most. Accordingly, in the case of measuring the height distribution of the surface of the color filter array 612 within the wafer 100 having a diameter of more than 100 mm, it is necessary to sample heights at a plurality of locations within the wafer 100.

The difference in thickness among the color filters 61 in the color filter array 612 is considered to result from the above-mentioned high-power cleaning method, namely, the two-fluid cleaning method. More specifically, the surface of the color filter array 612 is scraped off by the fluid 120 sprayed with high pressure, so that the thickness of the color filter array 612 is reduced from the thickness of the original color filter film 610. In addition, the amount of reduction in thickness of the color filter array 612 differs between the portions above with the nozzle 110 has passed and the portions above which the nozzle 110 has not passed. Thus, the thickness of the color filter array 612 varies. The smaller the thickness of the color filter 61 is, the higher the transmittance of the color filter 61 is. As a result, at a pixel where the thickness of the color filter 61 is small, the sensitivity is higher as compared with that at a pixel where the thickness of the color filter 61 is large.

In the imaging apparatus IS, a thinner color filter is required for the higher sensitivity and the miniaturization thereof. For example, the thickness of the color filter is preferably less than 0.75 μm, and the thickness of the color filter is preferably less than 0.20 times of the pixel size. The smaller the thickness of the color filter is, or the smaller the pixel size is, the higher the rate of the imaging characteristic change with respect to the variation in the thickness of the color filter is. Thus, in a thin color filter, the generation of the spiral unevenness exerts a notable influence on an image. Since recent imaging apparatuses have higher sensitivity, even if a difference in thickness among the color filters is only about several nm to several tens of nm, such a difference appears in an image. Particularly in a case in which the passivation film 4 is even as in the above-mentioned second example, the sensitivity increases, and unevenness can be prominently observed. In addition, since the interval G causing the periodical unevenness has an order much larger than the pixel size, the unevenness can be prominently observed in the image. More specifically, as the interval G is at least 10 times or more of the pixel size, the variation period of a thickness (film thickness) T is also 10 times or more of the pixel size. The interval G can be 100 times or more of the pixel size, and can also be 300 times or more of the pixel size. The interval G is, for example, 1 to 10 mm, and is typically 1 to 5 mm. The interval G is not totally equal, and can vary in the range of about ±1 mm. The unevenness in the image can be prominently observed in a case in which the diagonal length of an imaging region (effective pixel region) of the imaging apparatus is larger than the interval G. The unevenness in the image can be observed more prominently in an imaging apparatus with the diagonal length of an imaging region being more than 10 mm, for example, an advanced photo system (APS)-C size sensor and a 35-mm size sensor.

When the thickness of each of the color filters 61 is T, and an average value of the thicknesses of the color filters 61 is A, a variation magnitude M of the thickness of each of the color filters 61 is represented by the amplitude of a change of a difference Dif from the average value A of the thicknesses T, that is, the maximum value of Dif=|T−A|. If the ratio of the variation magnitude M to the average value A, i.e., a ratio R=100×M/A (%) is 2.0% or less, the influence of the variation in thickness of the color filter array that is exerted on an image is negligible. In other words, the variation magnitude M needs to be 2.0% or less of the average value A. For example, the variation magnitude M is preferably 1 nm or more and 20 nm or less, more preferably 10 nm or less. The description will be given below of exemplary embodiments for achieving the reduction of unevenness in the above-described manner.

First Exemplary Embodiment

Figure 4A:
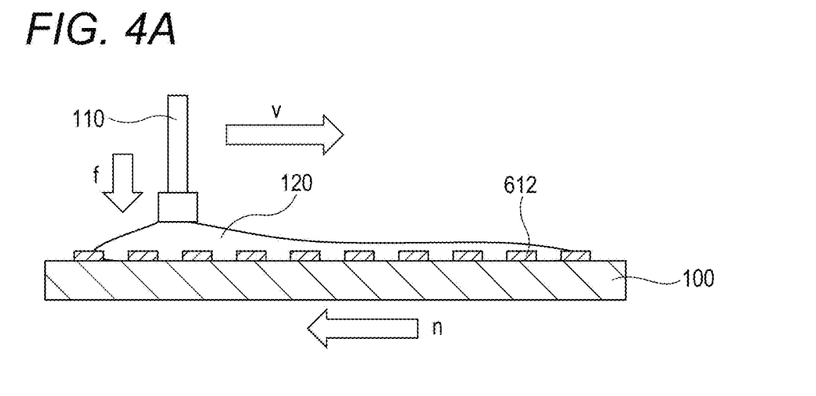
FIGS. 4A, 4B, and 4C are schematic views illustrating a method for forming a color filter array.
Figure 4B:
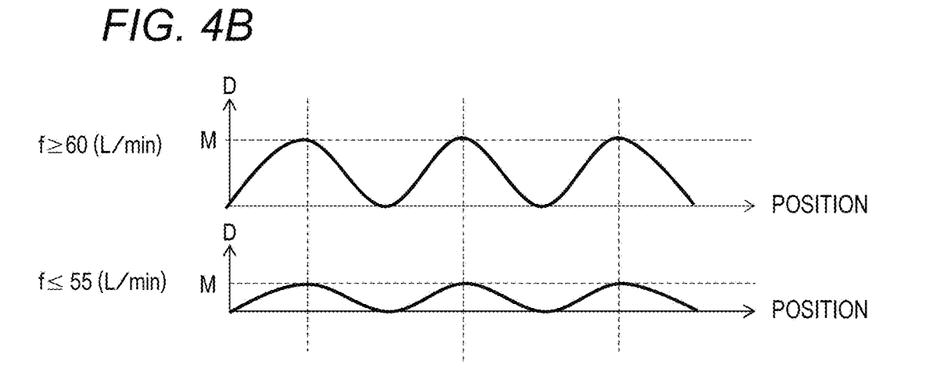
Figure 4C:
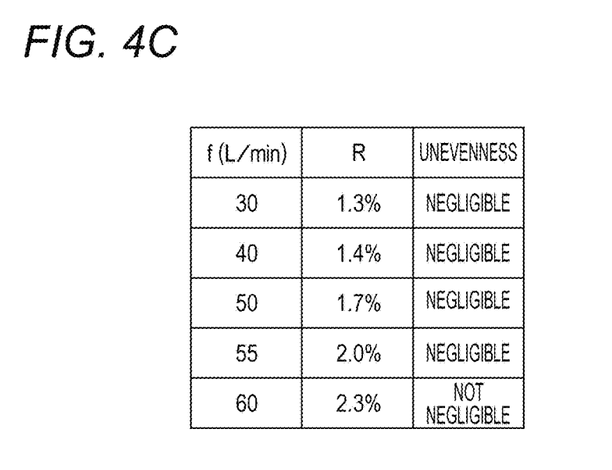

The present exemplary embodiment aims to reduce the variation magnitude M of the thickness by reducing the reduction amount of the thickness T of the color filter 61. More specifically, a flow rate F of gas in the fluid 120 is set to 55 (L/min) or less. As illustrated in FIG. 4B, in a case in which the flow rate F of gas in the fluid 120 is 55 (L/min) or less, the variation is smaller than that in a case in which the flow rate F is 60 (L/min) or more. In addition, as illustrated in FIG. 4C, in a case in which the flow rate F is 55 (L/min) or less, the ratio R is 2.0% or less, so that unevenness in an image becomes a negligible level (unevenness: negligible). The data illustrated in FIG. 4C assumes that the number of rotations n=700 (rpm), the movement speed v=40 (mm/s), and the flow rate of liquid (water) in the fluid 120 is 0.1 (L/min). The data illustrated in FIG. 4C employs a median value of the measurement results of the variation magnitudes M of the thicknesses obtained from a plurality of samples with the average value (A) of the thicknesses T of the color filters 61 being 0.67 µm. The flow rate of liquid in the fluid 120 is very small as compared with the flow rate of gas, namely, 1/10 or less. Thus, even if the flow rate of liquid is changed, the variation magnitude M of the thickness T remains almost unchanged.

Second Exemplary Embodiment

Figure 5A:
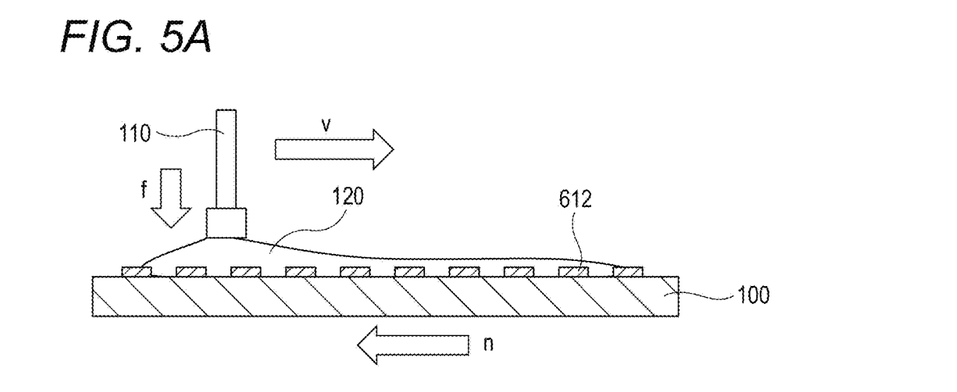
FIGS. 5A, 5B, and 5C are schematic views illustrating a method for forming a color filter array.
Figure 5B:
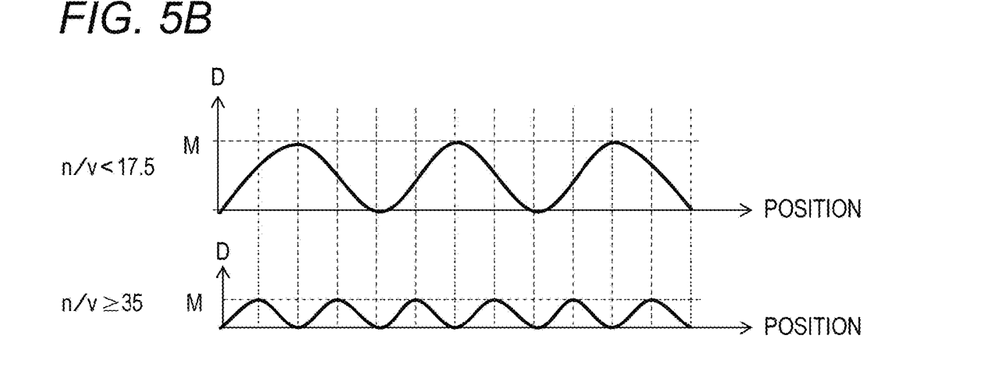

The present exemplary embodiment aims to reduce the variation magnitude M of the thickness by reducing the interval G of the portions above which the nozzle 110 has passed and the portions above which the nozzle 110 has not passed that are included in the color filter array 612. More specifically, the number of rotations n (rpm) of the color filter array 612 and the movement speed v (mm/s) of the nozzle 110 are set so as to satisfy a relation n/v≥35. If the relation n/v≥35 is satisfied, the interval G=60×v/n≤1.7 (mm). In view of the spread of the fluid 120 sprayed from the nozzle 110, if the interval G of the portions above which the nozzle 110 has passed is set to 1.7 (mm) or less, no substantial difference in cleaning degree is caused between the portions above which the nozzle 110 has passed and the portions above which the nozzle 110 has not passed. Thus, as illustrated in FIG. 5B, both the period and amplitude of the variation in the film thickness T can be reduced. In particular, a diameter D (mm) of the spray port of the nozzle 110 is preferably set so as to satisfy a relation D>60×v/n. If this relation is satisfied with the diameter D being 5 to 10 (mm), a relation n/v 35≥60/D>6 is satisfied.

Figure 5C:
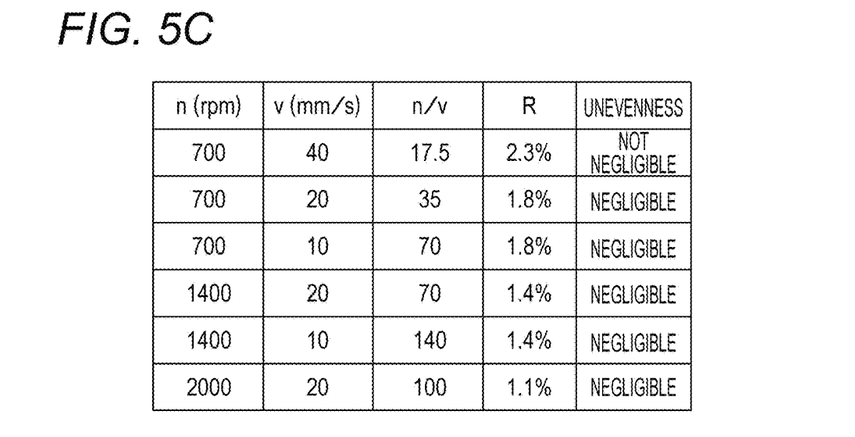

In addition, as illustrated in FIG. 5C, when a relation n/v≥35 is satisfied, the ratio R is 2.0% or less, so that unevenness in an image becomes a negligible level (unevenness: negligible). The data illustrated in FIG. 5C assumes that the flow rate of liquid (water) in the fluid 120 is 0.1 (L/min), and the flow rate of gas (nitrogen) is 60 (L/min). The data illustrated in FIG. 5C employs a median value of the measurement results of the variation magnitudes M of the thicknesses obtained from a plurality of samples with the average value (A) of the thicknesses T of the color filters 61 being 0.70 µm. Furthermore, if the flow rate of gas (nitrogen) is set to 55 (L/min) or less as described in the first exemplary embodiment, the variation in the thickness T is further reduced, so that unevenness can be improved.

Third Exemplary Embodiment

Figure 6A:
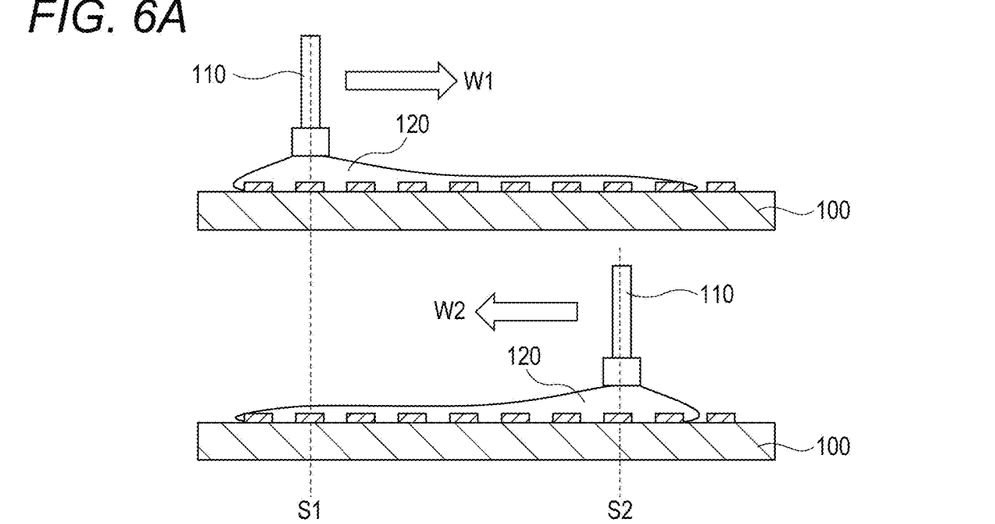
FIGS. 6A, 6B, and 6C are schematic views illustrating a method for forming a color filter array.
Figure 6B:
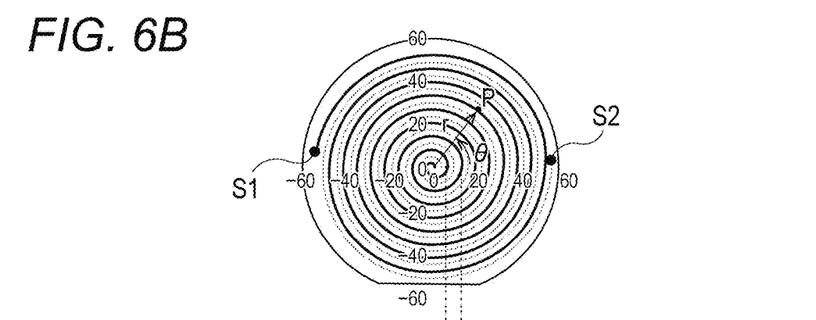

In the present exemplary embodiment, the nozzle 110 is initially caused to spirally pass with respect to the color filter array 612 according to a first movement W1 of the nozzle 110. The nozzle 110 is then caused to spirally pass with respect to the color filter array 612 according to a second movement W2 of the nozzle 110. At this time, the portion above which the nozzle 110 passes according to the second movement W2 is a portion between the portions above which the nozzle 110 has spirally passed according to the first movement W1. Such a configuration reduces the difference in the thickness T of the color filters between the portions above which the nozzle 110 has passed and the portions above which the nozzle 110 has not passed. For example, the nozzle 110 can be moved so that phases with respect to the period of the spiral lotus are inverted between the first movement W1 and the second movement W2. More specifically, the nozzle 110 is moved so that the phase is shifted by odd number/2 times with respect to the period of the spiral unevenness generated when the spray nozzle is moved once. To achieve this, for example, as illustrated in FIG. 6B, a start point S1 of the first movement W1 and a start point S2 of the second movement W2 are symmetrically positioned about the center of the substrate. Alternatively, the start point S2 of the second movement W2 is positioned so as to be shifted from the start point S1 of the first movement W1 by G/2 toward the central axis. In addition to these methods, there are other various methods for moving the nozzle 110 to achieve the lotus as illustrated in FIG. 6B.

Figure 6C:
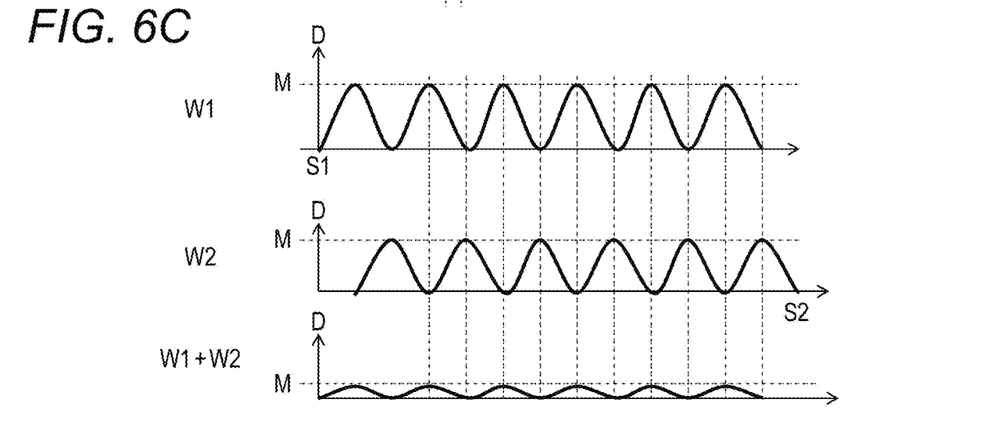

Through such methods, as illustrated in FIG. 6C, unevenness generated by the first movement W1 and unevenness generated by the second movement W2 are overlapped. Then, the variations of the thicknesses T of the color filters are balanced out, so that unevenness in an image can be reduced.

The above-mentioned exemplary embodiments can be appropriately modified and combined without departing from the technical idea of the present invention.

In the above exemplary embodiments, the description has been given of the cleaning step conducted in the formation of the color filter array 611, which is formed first and includes, for example, a green color light filter. Alternatively, the present invention is also applicable to the cleaning step conducted in the formation of the color filter array 631, which is formed last and includes, for example, a red color light filter. In addition, the present invention is also applicable to the cleaning step conducted in the formation of a color filter array including a blue color light filter. Since the color filter array 611 that is formed first is formed on a flat surface, the variation in the thickness T is prominent. Thus, the cleaning step is preferably performed with the above-mentioned conditions. In addition, the color filter array 631 that is formed last is preferably formed to be thin so as to reduce the overlap with a color filter with another color. Thus, the cleaning step is preferably performed with the above-mentioned conditions. In addition, a plurality of cleaning steps is performed until the last color filter array is formed. Thus, in the formation of all the color filter arrays, the cleaning steps are preferably performed with the above-mentioned conditions.

As described above, if the two-fluid cleaning method is used, there can be formed a color filter array in which the thicknesses T of the respective color filters of a plurality of pixels having the color filters 61 with the same color periodically vary at an interval of 10 times or more of the size of the plurality of pixels. Nevertheless, according to the first, the second, and the third exemplary embodiments, by setting the amplitude of the variation (the variation magnitude M) of the thickness T to 2.0% or less of the average value A of the thicknesses T, the influence of the variation in the thickness T that is exerted on an image can be reduced.

In the above-mentioned exemplary embodiments, the description has been given of unevenness generated in a captured image in an imaging apparatus. Alternatively, in a display apparatus including a color filter array, unevenness generated in a display image can be reduced.

According to the present invention, periodical unevenness resulting from a color filter array can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-176288, filed Aug. 29, 2014, which is hereby incorporated by reference herein in its entirety.

What is claimed is:

1. An imaging apparatus including a plurality of pixels respectively having color filters with the same color,
    wherein an average value of thicknesses of the respective color filters of the plurality of pixels is less than 0.75 µm,
    wherein the thicknesses of the respective color filters of the plurality of pixels periodically change at an interval of 10 times or more of an interval between the plurality of pixels, and
    wherein an amplitude of the change is 2.0% or less of the average value.

2. The imaging apparatus according to claim 1, wherein each of the color filters is a green color light filter or a red color light filter.

3. The imaging apparatus according to claim 1, wherein the average value is less than 0.20 times of a size of each of the plurality of pixels.

4. The imaging apparatus according to claim 1, wherein the amplitude of the change is 1 nm or more and 10 nm or less.

5. The imaging apparatus according to claim 1, wherein a plurality of aluminum layers is arranged below the color filters,
    wherein a passivation film is arranged between the plurality of aluminum layers and the color filters, and
    wherein a planarizing film is arranged between an aluminum layer that is closest to the passivation film among the plurality of aluminum layers and the passivation film.

* * * * *